United States Patent
Abel

(10) Patent No.: US 12,506,011 B2
(45) Date of Patent: Dec. 23, 2025

(54) METHODS FOR WET ATOMIC LAYER ETCHING OF TRANSITION METAL OXIDE DIELECTRIC MATERIALS

(71) Applicant: Tokyo Electron Limited, Tokyo (JP)

(72) Inventor: Kate Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 213 days.

(21) Appl. No.: 18/542,181

(22) Filed: Dec. 15, 2023

(65) Prior Publication Data

US 2025/0201572 A1    Jun. 19, 2025

(51) Int. Cl.
*H01L 21/311*    (2006.01)
*H01L 21/02*    (2006.01)

(52) U.S. Cl.
CPC .. *H01L 21/31111* (2013.01); *H01L 21/02181* (2013.01); *H01L 21/02189* (2013.01); *H01L 21/02227* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 5,374,328 A | 12/1994 | Remba et al. | |
| 6,616,014 B1 | 9/2003 | Pozniak et al. | |
| 6,841,031 B2 | 1/2005 | Iwata et al. | |
| 6,896,600 B1 | 5/2005 | Wu et al. | |
| 7,683,021 B2 | 3/2010 | Shea et al. | |
| 8,597,769 B2 | 12/2013 | Takaya et al. | |
| 10,157,756 B2 | 12/2018 | Yamada | |
| 10,982,335 B2 | 4/2021 | Abel | |
| 11,656,197 B2 | 5/2023 | Choi et al. | |
| 11,802,342 B2 | 10/2023 | Abel | |
| 2002/0004303 A1 | 1/2002 | Agnello | |

(Continued)

FOREIGN PATENT DOCUMENTS

| | | |
|---|---|---|
| KR | 1020170022922 | 3/2017 |
| KR | 1020170077839 | 7/2017 |

(Continued)

OTHER PUBLICATIONS

The International Search Report and the Written Opinion, Application No. PCT/US2024/051102; Jan. 14, 2025; 12 pgs.

(Continued)

*Primary Examiner* — Binh X Tran
(74) *Attorney, Agent, or Firm* — Egan, Enders & Huston LLP.

(57) ABSTRACT

The present disclosure provides a new wet atomic layer etch (ALE) process for etching high-k dielectric materials. More specifically, the present disclosure provides various embodiments of methods that utilize new etch chemistries for etching transition metal oxide dielectric materials in a cyclic wet ALE process. In the example embodiments provided herein, new etch chemistries and methods are provided for etching zirconium dioxide ($ZrO_2$), hafnium dioxide ($HfO_2$) and $Hf_xZr_{(1-x)}O_2$ dielectrics in a cyclic wet ALE process. However, the wet ALE techniques described herein are not strictly limited to the example materials discussed herein and can be applied to other transition metals and transition metal oxides.

22 Claims, 9 Drawing Sheets

(56) References Cited

U.S. PATENT DOCUMENTS

| | | |
|---|---|---|
| 2003/0087528 A1 | 5/2003 | Kruwinus |
| 2006/0289389 A1 | 12/2006 | Shea |
| 2009/0007938 A1 | 1/2009 | Dubreuil et al. |
| 2009/0047790 A1 | 2/2009 | Raghu et al. |
| 2010/0279435 A1 | 11/2010 | Xu et al. |
| 2011/0094888 A1 | 4/2011 | Chen et al. |
| 2012/0031768 A1 | 2/2012 | Reid et al. |
| 2014/0199840 A1 | 7/2014 | Bajaj et al. |
| 2014/0370643 A1 | 12/2014 | Stern et al. |
| 2016/0089686 A1 | 3/2016 | Lee et al. |
| 2016/0141210 A1 | 5/2016 | Lei et al. |
| 2016/0372320 A1 | 12/2016 | Emoto |
| 2017/0053810 A1 | 2/2017 | Yang et al. |
| 2017/0194196 A1 | 7/2017 | Brink et al. |
| 2017/0356084 A1 | 12/2017 | Nakanishi et al. |
| 2018/0090352 A1 | 3/2018 | Sotoku et al. |
| 2018/0226278 A1 | 8/2018 | Arnepalli et al. |
| 2018/0374936 A1 | 12/2018 | Kelly et al. |
| 2019/0011734 A1 | 1/2019 | Otsuji |
| 2019/0027383 A1 | 1/2019 | Nakal et al. |
| 2019/0148192 A1 | 5/2019 | Yamaguchi |
| 2019/0295856 A1 | 9/2019 | Tahara et al. |
| 2019/0348274 A1 | 11/2019 | Park et al. |
| 2020/0161148 A1 | 5/2020 | Abel |
| 2020/0377792 A1 | 12/2020 | Guske et al. |
| 2021/0193801 A1 | 6/2021 | Wang et al. |
| 2022/0102495 A1 | 3/2022 | Maxey et al. |
| 2022/0344330 A1 | 10/2022 | Yeo et al. |
| 2023/0008409 A1 | 1/2023 | Chou et al. |
| 2023/0008517 A1 | 1/2023 | Cheng et al. |
| 2023/0117790 A1* | 4/2023 | Abel .................. H01L 21/0228 438/758 |
| 2023/0121246 A1 | 4/2023 | Abel |
| 2024/0079249 A1* | 3/2024 | Lee .................. H01L 21/31122 |

FOREIGN PATENT DOCUMENTS

| | | |
|---|---|---|
| WO | 2017099718 | 6/2017 |
| WO | 2017205658 | 11/2017 |
| WO | 2018004649 | 1/2018 |

OTHER PUBLICATIONS

International Search Report issued in Application No. PCT/US2019/061683, Mar. 13, 2020, 9 pgs.

International Search Report Issued in Application No. PCT/US2019/061678, Mar. 13, 2020, 8 pgs.

International Search Report and the Written Opinion; PCT/US2022/077672, Jan. 27, 2023, 11 pgs.

Fadelli, "A Method to Reliably Fabricate Transition Metal Dichalcogenide Field-Effect Transistors on a Wafer-Scale", Jan. 12, 2023, 4 pgs.

Han et al., "Syntheis, Properties and Potential Applications of Two-Dimensional Transition Metal Dichalcogenides", Nano Covergence, 2015, 14 pgs.

Wikipedia, "Transition Metal Dichalcogenide Monolayers", Obtained from Internet Nov. 2023, 27 pgs.

\* cited by examiner

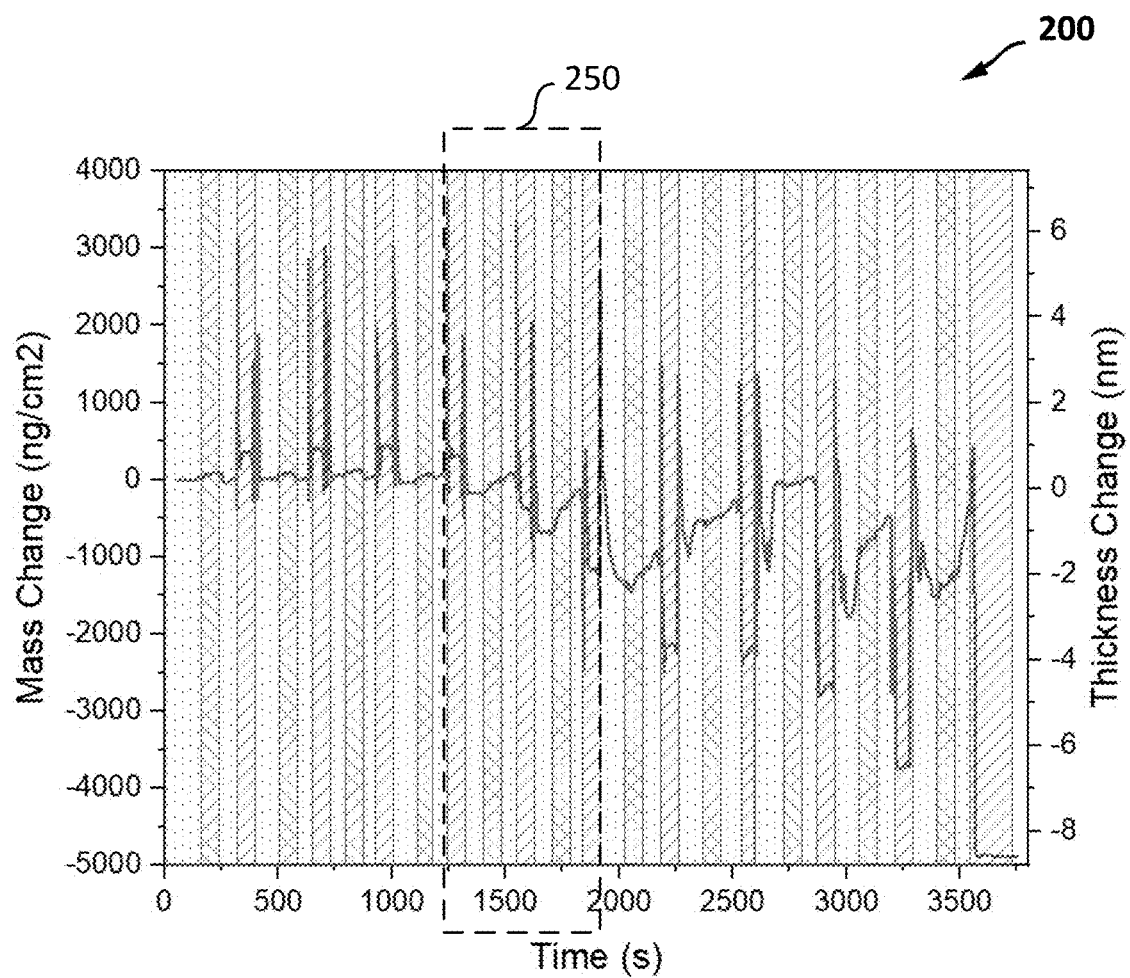
*FIG. 2A*
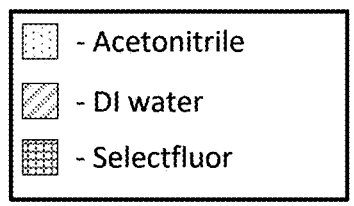

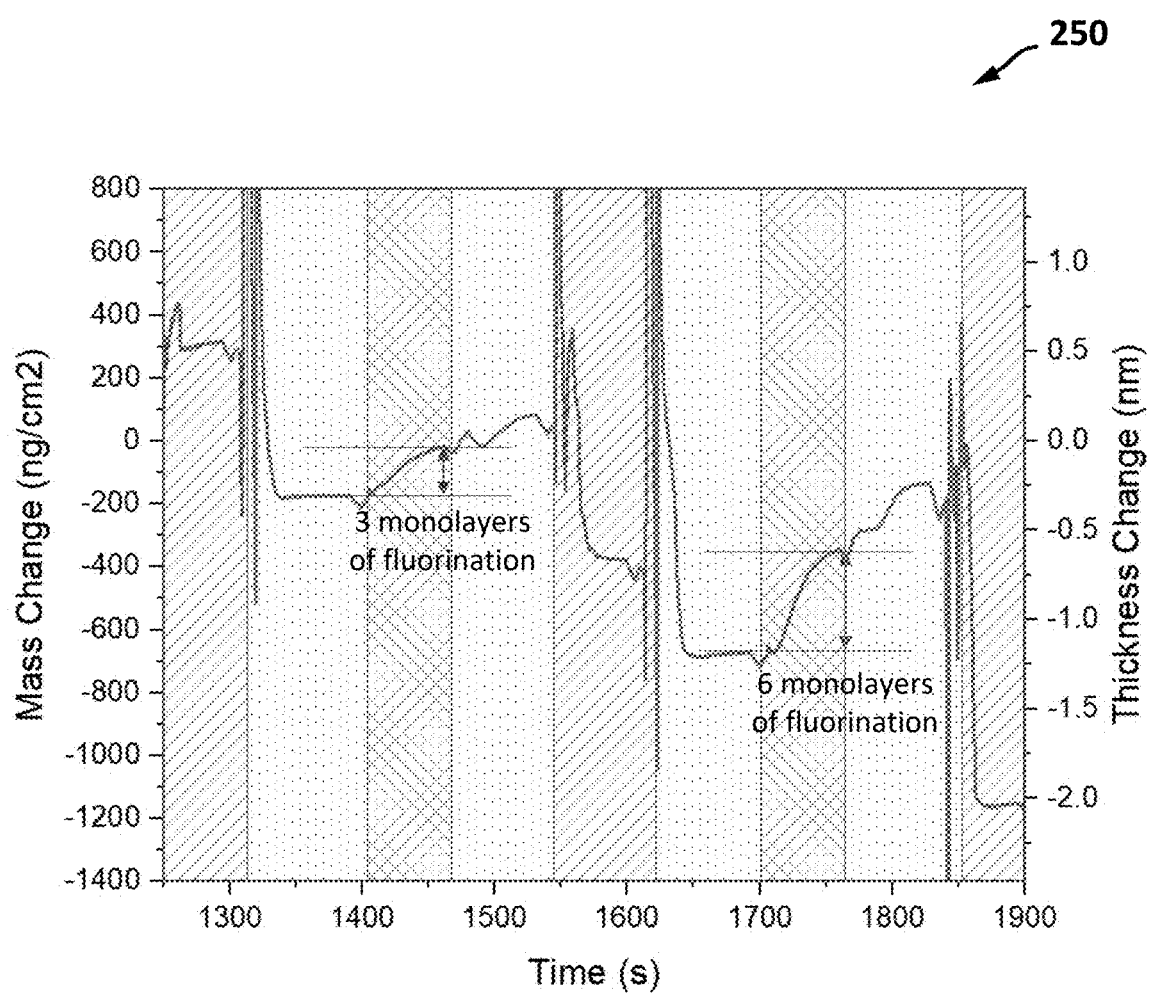
*FIG. 2B*
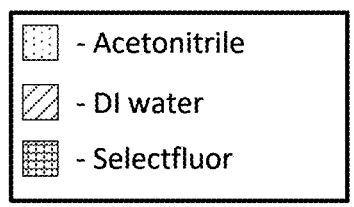

METHODS FOR WET ATOMIC LAYER ETCHING OF TRANSITION METAL OXIDE DIELECTRIC MATERIALS

RELATED APPLICATION

The present disclosure is related to U.S. patent application Ser. No. 17/674,579, now U.S. Pat. No. 11,802,342, which is entitled "METHOD FOR WET ATOMIC LAYER ETCHING OF RUTHENIUM," filed Feb. 17, 2022; the disclosure of which is expressly incorporated herein, in their entirety, by reference.

BACKGROUND

This disclosure relates to semiconductor device manufacturing, and, in particular, to the etching of dielectric materials formed on semiconductor substrates.

As geometries of substrate structures continue to shrink and the types of structures evolve, the challenges of etching substrates have increased. One technique that has been utilized to address these challenges is atomic layer etching (ALE). ALE is a process that removes thin layers sequentially through one or more self-limiting reactions. For example, ALE typically refers to techniques that can etch with atomic precision, i.e., by removing material one or a few monolayers of material at a time. ALE processes generally rely on a chemical modification of the surface to be etched followed by a selective removal of the modified layer. Thus, ALE processes offer improved etch performance by decoupling the etch process into sequential steps of surface modification and removal of the modified surface. In some embodiments, an ALE process may include multiple cyclic series of layer modification and etch steps, where the modification step modifies the exposed surfaces and the etch step selectively removes the modified layer. In such processes, a series of self-limiting reactions may occur and the cycle may be repeatedly performed until a desired or specified etch amount is achieved. In other embodiments, an ALE process may use just one cycle.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process leads to smoothing of the surface during etching rather than the roughening commonly seen during other etch processes.

A wet ALE process typically begins with a surface modification step, which exposes a material to a first solution to create a self-limiting modified surface layer. The modified surface layer may be created through oxidation, reduction, ligand binding, or ligand exchange. Ideally, the modified surface layer is confined to the top monolayer of the material and acts as a passivation layer to prevent the modification reaction from progressing any further. After the modified surface layer is formed, the wet ALE process may expose the modified surface layer to a second solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

Etching dielectric materials is a critical process in many semiconductor fabrication processes. When fabricating transition metal dichalcogenide (TMD) transistors, for example, high-k dielectric materials, such as zirconium dioxide ($ZrO_2$) and hafnium dioxide ($HfO_2$), are often used as insulators for gate contact isolation. For TMD transistor fabrication, current integration schemes require etching through the high-k gate insulation to open transistor source and drain contacts. This etch must be both gentle and highly selective to the two-dimensional (2D) TMD materials (e.g., $MoS_2$, $MoSe_2$, $WS_2$, $WSe_2$, etc.) provided within the channel of the TMD transistor. Traditional methods for etching high-k gate insulation materials (such as $ZrO_2$ and $HfO_2$) include plasma etching with gas-phase hydrogen fluoride (HF) or wet etching with dilute hydrofluoric acid (HF) solution. However, the traditional methods used for etching these materials are unsatisfactory, since plasma etching methods destroys the TMD crystallinity, and wet etching with dilute HF solution leads to a continuous wet etch, which is not selective enough to prevent TMD damage.

A need, therefore, exists for improved methods for etching high-k dielectric materials, including but not limited to, transition metal oxide dielectric materials used as insulators for gate contact isolation in TMD transistors.

SUMMARY

The present disclosure provides a new wet atomic layer etch (ALE) process for etching high-k dielectric materials. More specifically, the present disclosure provides various embodiments of methods that utilize new etch chemistries for etching transition metal oxide dielectric materials in a cyclic wet ALE process. In the example embodiments provided herein, new etch chemistries and methods are provided for etching zirconium dioxide ($ZrO_2$), hafnium dioxide ($HfO_2$) and $Hf_xZr_{(1-x)}O_2$ (wherein as used herein 0<x<1) dielectrics in a cyclic wet ALE process. However, the wet ALE techniques described herein are not strictly limited to the example materials discussed herein and can be applied to other transition metals and transition metal oxides.

In the present disclosure, a wet ALE process for etching a transition metal oxide layer starts with the formation of an insoluble transition metal halide or oxyhalide passivation layer on the transition metal oxide surface. For example, the transition metal oxide layer may be exposed to a surface modification solution in a self-limiting surface modification step to chemically modify an exposed surface of the transition metal oxide and form a modified surface layer thereon. The modified surface layer may be a transition metal halide or oxyhalide passivation layer, which is self-limiting and insoluble in the surface modification solution.

After surface modification, a dissolution step may be performed to selectively remove the modified surface layer from the underlying transition metal oxide surface. Like the surface modification step, the dissolution step may also be self-limiting. For example, the modified surface layer may be exposed to a dissolution solution in which the modified surface layer is soluble, but the unmodified transition metal oxide is insoluble. The dissolution solution selectively dissolves the modified surface layer without removing the unmodified transition metal oxide underlying the modified surface layer. In some embodiments, the surface modification and dissolution steps may be repeated for one or more ALE cycles to repeatedly form a new modified surface layer and selectively remove the new modified surface layer, thus etching the transition metal oxide layer one modified surface layer at a time.

New etch chemistries are also provided in the present disclosure for etching a transition metal oxide layer using a wet ALE process. In the present disclosure, the surface modification solution is an aqueous or non-aqueous solution comprising an electrophilic halogenation agent (e.g., an electrophilic chlorinating agent, an electrophilic fluorinating agent or an electrophilic brominating agent). The electrophilic halogenation agent reacts with the exposed surface of the transition metal oxide to halogenate the transition metal oxide surface and form a transition metal halide or oxyhalide passivation layer. The dissolution solution selectively dissolves the transition metal halide or oxyhalide passivation layer (the modified surface layer) to etch the transition metal oxide layer. The dissolution solution can include a wide range of aqueous or non-aqueous solutions in which the modified surface layer is soluble, but the underlying, unmodified transition metal oxide is insoluble.

Accordingly, a wet ALE process is disclosed herein for etching a transition metal oxide layer. In some embodiments, the wet ALE process may be utilized in the fabrication of transition metal dichalcogenide (TMD) transistors when etching through the high-k gate dielectric materials to open the transistor source and drain contacts. Unlike the conventional plasma and wet etch processes used to etch such materials, the wet ALE process and wet etch chemistries disclosed herein are highly selective to the two-dimensional (2D) TMD material used in the channel region of the TMD transistors. The high selectivity provided by the disclosed wet etch chemistries enables the TMD material to be used as an etch stop and promote a soft landing on the TMD material without damaging or destroying the crystallinity of the TMD material. In addition to promoting a soft landing on the TMD material, the wet ALE process and wet etch chemistries disclosed herein improve etch uniformity, provide greater control over the etch amount, decrease the amount of over-etch typically required to open source/drain contact holes and leave the post-etch transition metal oxide surface smoother than the incoming surface. These advantages facilitate use of the wet ALE process and wet etch chemistries disclosed herein within TMD transistor fabrication process flows.

As noted above and described further herein, the present disclosure provides various embodiments of methods that utilize new etch chemistries for etching a transition metal oxide layer in a wet ALE process. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

According to one embodiment, a method of etching a dielectric layer is provided herein. The method may generally include receiving a substrate having a transition metal oxide layer formed thereon, wherein a surface of the transition metal oxide layer is exposed on a surface of the substrate, and exposing the surface of the substrate to a surface modification solution comprising an electrophilic halogenation agent. When exposed to the surface modification solution, the electrophilic halogenation agent reacts with the surface of the transition metal oxide layer to form a transition metal halide or oxyhalide passivation layer, which is self-limited and insoluble in the surface modification solution. Next, the method may include removing the surface modification solution from the surface of the substrate subsequent to forming the transition metal halide or oxyhalide passivation layer, and exposing the surface of the substrate to a dissolution solution that reacts with the transition metal halide or oxyhalide passivation layer to form soluble species that are dissolved by the dissolution solution. Next, the method may include removing the dissolution solution and the soluble species from the substrate to etch the transition metal oxide layer.

In some embodiments, the method may further include repeating the steps of exposing the surface of the substrate to the surface modification solution, removing the surface modification solution, exposing the surface of the substrate to the dissolution solution, and removing the dissolution solution a number of cycles until a predetermined amount of the transition metal oxide layer is removed from the substrate.

According to another embodiment, a method etching a dielectric layer using a wet atomic layer etching (ALE) process is provided herein. The method may generally include: a) receiving a substrate, the substrate having a transition metal oxide layer formed thereon; b) exposing the transition metal oxide layer to a surface modification solution containing an electrophilic halogenating agent, wherein the electrophilic halogenating agent reacts with an exposed surface of the transition metal oxide layer to form a modified surface layer containing a transition metal halide or oxyhalide; c) rinsing the substrate with a first purge solution to remove the surface modification solution from a surface of the substrate; d) exposing the modified surface layer to a dissolution solution to dissolve the modified surface layer and uncover an unmodified surface of the transition metal oxide layer underlying the modified surface layer; e) rinsing the substrate with a second purge solution to remove the dissolution solution from the surface of the substrate; and f) repeating steps b)-e) for one or more cycles until a predetermined amount of the transition metal oxide layer is removed from the substrate.

A variety of different etch chemistries may be used in the surface modification and dissolution solutions used in the method embodiments discussed above. For example, the surface modification solution may generally include an electrophilic halogenation agent dissolved in an aqueous or non-aqueous solvent. The dissolution solution may generally include an aqueous solvent or an aqueous solution containing a ligand.

The electrophilic halogenation agent included within the surface modification solution may include an electrophilic fluorinating agent, an electrophilic chlorinating agent or an electrophilic brominating agent. Examples of electrophilic fluorinating agents include, but are not limited to, 1-chloromethyl-4-fluoro-1,4-diazoniabicyclo[2.2.2]octane bis(tetrafluoroborate) (tradename Selectfluor™), 1-fluoropyridinium triflate, 1-fluoro-2,4,6-trimethylpyridinium tetrafluoroborate, N-fluorobenzenesulfonimide, fluoroxytrifluoromethane, perchloryl fluoride, xenon difluoride and N-fluorobis[(trifluoromethyl)sulfonyl]imide. Examples of electrophilic chlorinating agents include, but are not limited to, trichloroisocyanuric acid (TCCA), oxalyl chloride, thionyl chloride, N-chlorosuccinimide, 1-chlorobenzotriazole, Chloramine-T and tert-butyl-N-chlorocyanamide. Examples of electrophilic brominating agents include N-bromosuccinimide, dibromoisocyanuric acid, tribromocyanuric acid, 1,3-

Dibromo-5,5-Dimethylhydantoin and N-Bromoacetamide. In some embodiments, the electrophilic halogenation agent may be dissolved in an aqueous solvent, such as deionized (DI) water. In other embodiments, the electrophilic halogenation agent may be dissolved in a non-aqueous solvent such as an alcohol, an ether, a ketone, a halocarbon, a heterocyclic or another polar organic solvent. Examples of non-aqueous solvents include, but are not limited to, acetonitrile, ethyl acetate, acetone, dimethyl sulfoxide, furans, dimethylformamide, methanol, isopropanol and dioxane.

A variety of different etch chemistries may be used in the surface modification and dissolution solutions depending on the particular transition metal oxide to be etched. In some embodiments, for example, the transition metal oxide layer to be etched may be a zirconium dioxide ($ZrO_2$), hafnium dioxide ($HfO_2$) or hafnium zirconium oxide ($Hf_xZr_{(1-x)}O_2$) dielectric layer.

In some embodiments, the transition metal oxide layer to be etched may be a zirconium dioxide ($ZrO_2$) dielectric layer. When the transition metal oxide layer to be etched is a zirconium dioxide ($ZrO_2$) dielectric layer, the surface modification solution may include an electrophilic fluorinating agent, which reacts with a surface of the zirconium dioxide ($ZrO_2$) dielectric layer to form a zirconium fluoride passivation layer. When an electrophilic fluorinating agent is used in the surface modification solution to form a zirconium fluoride passivation layer on a zirconium dioxide ($ZrO_2$) surface, the dissolution solution may include an aqueous solvent. When exposed to an aqueous solvent, the zirconium fluoride passivation layer forms water-soluble zirconium fluoride hydrates which are dissolved by the aqueous solvent.

In other embodiments, the transition metal oxide layer to be etched may be a hafnium dioxide ($HfO_2$) dielectric layer. When the transition metal oxide layer to be etched is a hafnium dioxide ($HfO_2$) dielectric layer, the surface modification solution may include an electrophilic fluorinating agent, which reacts with a surface of the hafnium dioxide ($HfO_2$) dielectric layer to form a hafnium fluoride passivation layer. When an electrophilic fluorinating agent is used in the surface modification solution to form a hafnium fluoride passivation layer on the hafnium dioxide ($HfO_2$) surface, the dissolution solution may include an aqueous solvent or an aqueous solution containing a ligand. For example, the dissolution solution may be an aqueous hydrochloric acid (HCl) solution. When exposed to an aqueous HCl solution, the hafnium fluoride passivation layer forms hafnium oxychloride species, which are dissolved by the aqueous HCl solution.

According to yet another embodiment, a method of forming a transition metal dichalcogenide (TMD) transistor is provided herein. The method may generally include providing a substrate, the substrate comprising a first oxide layer formed on the substrate, a TMD material formed on the first oxide layer and a second oxide layer formed on the TMD material. In some embodiments, the second oxide layer may be a transition metal oxide layer, such as a zirconium dioxide ($ZrO_2$), hafnium dioxide ($HfO_2$) or hafnium zirconium oxide ($Hf_xZr_{(1-x)}O_2$) dielectric layer. Next, the method may include providing a hard mask pattern on the second oxide layer and selectively removing portions of the second oxide layer not covered by the hard mask pattern using a wet atomic layer etching (ALE) process.

The wet ALE process may generally include: (a) exposing a surface of the substrate to a surface modification solution comprising an electrophilic halogenation agent, wherein the electrophilic halogenation agent reacts with an exposed surface of the second oxide layer to form a transition metal halide or oxyhalide passivation layer, which is self-limiting and insoluble in the surface modification solution; (b) removing the surface modification solution from the surface of the substrate subsequent to forming the transition metal halide or oxyhalide passivation layer; (c) exposing the surface of the substrate to a dissolution solution that reacts with the transition metal halide or oxyhalide passivation layer to form soluble species that are dissolved by the dissolution solution; (d) removing the dissolution solution and the soluble species from the substrate to etch the second oxide layer; and (e) repeating steps (a)-(d) a number of cycles until the portions of the second oxide layer not covered by the hard mask pattern are selectively removed from the substrate without etching the TMD material underlying the second oxide layer.

In some embodiments, the method may further include removing the hard mask pattern to expose a portion of the second oxide layer underlying the hard mask pattern, and completing formation of the TMD transistor by forming a gate contact on the exposed portion of the second oxide layer and source and drain contacts on the TMD material.

A variety of different etch chemistries may be used in the surface modification and dissolution solutions depending on the particular transition metal oxide to be etched. When the transition metal oxide layer is a zirconium dioxide ($ZrO_2$) dielectric layer, for example, the surface modification solution may comprise an electrophilic fluorinating agent and the dissolution solution may comprise an aqueous solvent. When the zirconium dioxide ($ZrO_2$) dielectric layer is exposed to the surface modification solution, the electrophilic fluorinating agent reacts with a surface of the zirconium dioxide (ZrO2) dielectric layer to form a zirconium fluoride passivation layer. When the zirconium fluoride passivation layer is exposed to the dissolution solution, the zirconium fluoride passivation layer forms water-soluble zirconium fluoride hydrates, which are dissolved by the aqueous solvent.

When the transition metal oxide layer is a hafnium dioxide ($HfO_2$) dielectric layer, the surface modification solution may comprise an electrophilic fluorinating agent and the dissolution solution may comprise an aqueous hydrochloric acid (HCl) solution. When the hafnium dioxide ($HfO_2$) dielectric layer is exposed to the surface modification solution, the electrophilic fluorinating agent reacts with a surface of the hafnium dioxide (HfO2) dielectric layer to form a hafnium fluoride passivation layer. When the hafnium fluoride passivation layer is exposed to the dissolution solution, the hafnium fluoride passivation layer forms hafnium oxychloride species, which are dissolved by the aqueous HCl solution.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 2A-2B are graphs of quartz crystal microbalance (QCM) data obtained from a wet ALE process experiment, which used an example wet etch chemistry in accordance with the present disclosure to etch a zirconium dioxide ($ZrO_2$) surface.

DETAILED DESCRIPTION

The present disclosure provides a new wet atomic layer etch (ALE) process for etching high-k dielectric materials. More specifically, the present disclosure provides various embodiments of methods that utilize new etch chemistries for etching transition metal oxide dielectric materials, such as zirconium dioxide ($ZrO_2$), hafnium dioxide ($HfO_2$) and $Hf_xZr_{(1-x)}O_2$ dielectrics, in a wet ALE process.

In general, the wet ALE process described herein can be used to etch a transition metal oxide layer by performing one or more cycles of the wet ALE process, where each cycle includes a surface modification step and a dissolution step. In the surface modification step, an exposed surface of the transition metal oxide dielectric layer is exposed to a surface modification solution to chemically modify the exposed surface of the transition metal oxide dielectric layer and form a modified surface layer (e.g., a transition metal halide or oxyhalide). In the dissolution step, the modified surface layer is selectively removed by exposing the modified surface layer to a dissolution solution to dissolve the modified surface layer. Purge steps may be performed between the surface modification and dissolution steps to prevent the surface modification and dissolution solutions from mixing, and the process may be repeated in a cyclic manner until a desired amount of etching is achieved.

In the disclosed embodiments, the wet ALE process described herein uses halogenation to form an insoluble transition metal halide or oxyhalide passivation layer over the unmodified transition metal oxide in a self-limiting surface modification step. More specifically, the wet ALE processes uses non-oxidative halogenation via electrophilic surface modification, which leaves the modified surface layer (e.g., transition metal halide or oxyhalide passivation layer) in the +4 oxidation state. After electrophilic surface modification, the transition metal halide or oxyhalide passivation layer is selectively dissolved in a self-limiting dissolution step to etch the transition metal oxide layer.

Figure 1:
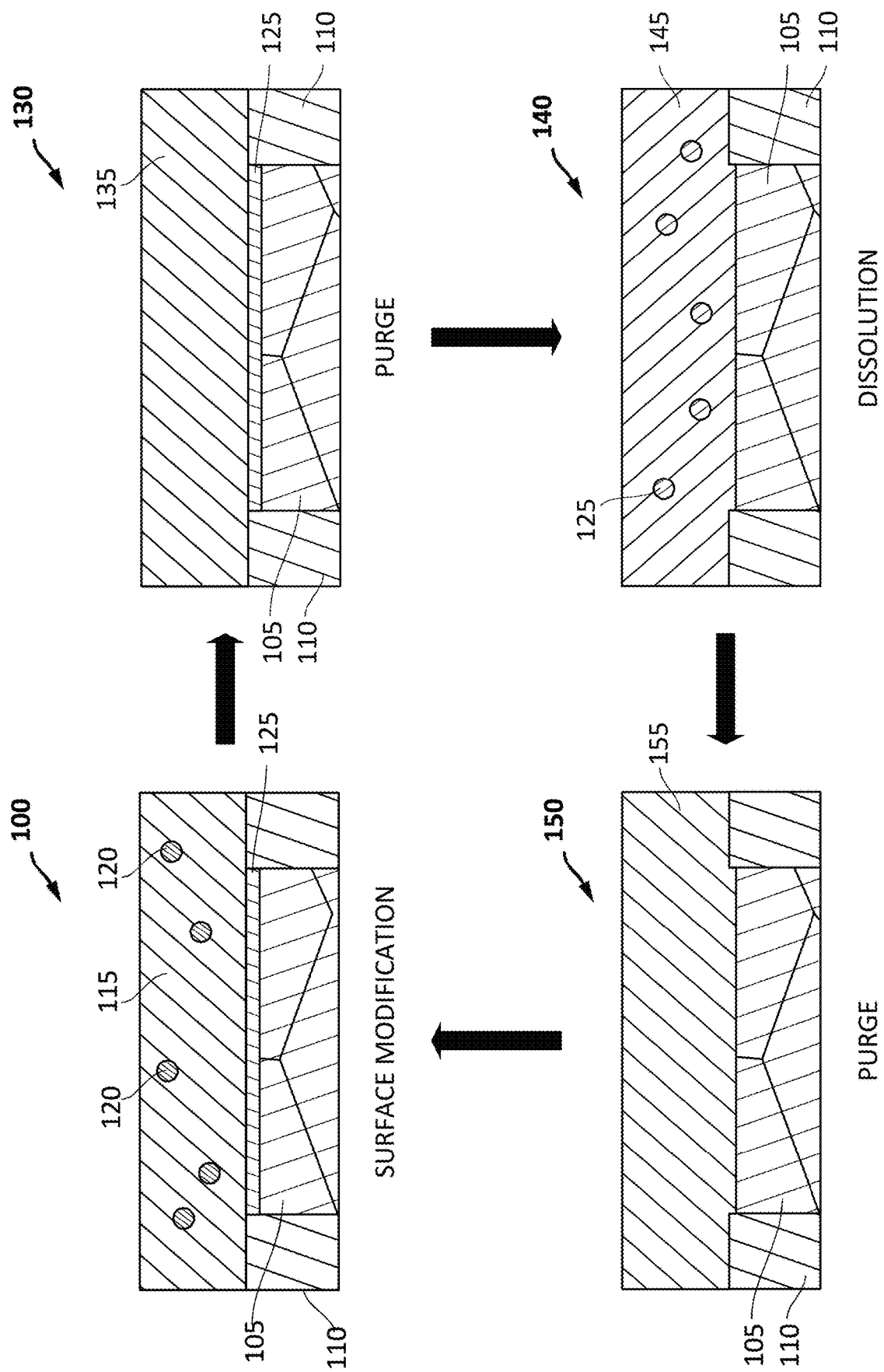
FIG. 1 illustrates one example of a cyclic wet atomic layer etching (ALE) process that can be used to etch a transition metal oxide layer in accordance with the present disclosure.

FIG. 1 illustrates one example of a wet ALE process in accordance with the present disclosure. More specifically, FIG. 1 illustrates exemplary steps performed during one cycle of a wet ALE process. In the process shown in FIG. 1, a high-k dielectric material 105 surrounded by another material 110 is brought in contact with a surface modification solution 115 during a surface modification step 100 to modify an exposed surface of the high-k dielectric material 105. In one embodiment, the high-k dielectric material 105 may be a transition metal oxide dielectric material, such as but not limited to, a zirconium dioxide ($ZrO_2$), hafnium dioxide ($HfO_2$) and $Hf_xZr_{(1-x)}O_2$ dielectric. The material 110 surrounding the high-k dielectric material 105 may be another dielectric, such as silicon dioxide ($SiO_2$), or a transition metal dichalcogenide (TMD) material, such as but not limited to, molybdenum disulfide ($MoS_2$), molybdenum diselenide ($MoSe_2$), tungsten disulfide ($WS_2$), tungsten diselenide ($WSe_2$), etc.

When exposed to the surface modification solution 115, a chemical reaction occurs at the exposed surface of the high-k dielectric material 105 to form a modified surface layer 125 in the surface modification step 100. The chemical reaction to form the modified surface layer 125 may be fast and self-limiting. In other words, the reaction product may modify one or more monolayers of the exposed surface of the high-k dielectric material 105, but may prevent any further reaction between the surface modification solution 115 and the underlying surface. By necessity, neither the high-k dielectric material 105 to be etched nor the modified surface layer 125 can be soluble in the surface modification solution 115. In some cases, the surface modification step 100 shown in FIG. 1 may continue until the surface reaction is driven to saturation.

The surface modification solution 115 used in the surface modification step 100 is an aqueous or non-aqueous solution containing an electrophilic halogenation agent 120. For example, the surface modification solution 115 may include an electrophilic fluorinating agent, an electrophilic chlorination agent or an electrophilic brominating agent in an aqueous or non-aqueous solvent. Examples of electrophilic halogenation agents and suitable solvents that can be included within the surface modification solution 115 are discussed in more detail below.

The electrophilic halogenation agent 120 included within the surface modification solution 115 reacts with the exposed surface of the high-k dielectric material 105 to halogenate the exposed surface. When a transition metal oxide surface (such as a $ZrO_2$, $HfO_2$ or $Hf_xZr_{(1-x)}O_2$ surface) is halogenated with the electrophilic halogenation agent 120, halogen molecules (e.g., $F_2$, $Cl_2$, or $Br_2$ molecules) within the electrophilic halogenation agent 120 modify the transition metal oxide surface to form a transition metal halide or oxyhalide passivation layer. The electrophilic halogenation agent 120 included within the surface modification solution 115 may be generally selected based on the thermodynamic stability and solubility of the metal halide compound. In some embodiments, electrophilic fluorinating agents may be preferred over electrophilic chlorinating or brominating agents. However, electrophilic chlorinating or brominating agents may also be used to halogenate the exposed surface of the high-k dielectric material 105 and form a modified surface layer 125.

After the modified surface layer 125 (e.g., transition metal halide or oxyhalide passivation layer) is formed, the substrate may be rinsed with a first purge solution 135 to remove excess reactants from the surface of the substrate in a first purge step 130. The first purge solution 135 should not react with the modified surface layer 125 or with the reagents present in the surface modification solution 115. In some embodiments, the first purge solution 135 used in the first purge step 130 may use the same solvent previously used in the surface modification step 100. In other embodiments, a different solvent may be used in the first purge solution 135. In some embodiments, the first purge step 130 may be long enough to completely remove all excess reactants from the substrate surface.

Once rinsed, a dissolution step 140 is performed to selectively remove the modified surface layer 125. In the dissolution step 140, the modified surface layer 125 is exposed to a dissolution solution 145 to selectively remove or dissolve the modified surface layer 125 to etch the high-k dielectric material 105. The modified surface layer 125 must be soluble in the dissolution solution 145, while the unmodified high-k dielectric material 105 underlying the modified surface layer 125 must be insoluble. The solubility of the modified surface layer 125 allows its removal through dissolution into the bulk dissolution solution 145. In some embodiments, the dissolution step 140 may continue until the modified surface layer 125 is completely dissolved.

A variety of different dissolution solutions 145 may be used in the dissolution step 140, depending on the surface modification solution 115 used and/or the modified surface layer 125 formed during the surface modification step 100. In some embodiments, the dissolution solution 145 may be an aqueous solution or a non-aqueous solution in which the modified surface layer 125 is soluble. In some embodiments, the dissolution solution 145 may contain a ligand (not shown), which assists in the dissolution process by reacting or binding with the modified surface layer 125 to form a soluble species that dissolves within the dissolution solution 145. Regardless of the particular dissolution solution 145 used, the dissolution step 140 selectively removes the modified surface layer 125 without removing the unmodified high-k dielectric material 105 underlying the modified surface layer 125.

Once the modified surface layer 125 is selectively removed, the ALE etch cycle shown in FIG. 1 is completed by performing a second purge step 150. The second purge step 150 is performed by rinsing the surface of the substrate with a second purge solution 155, which may be the same or different than the first purge solution 135. In some embodiments, the second purge solution 155 may use the same solvent that was used in the surface modification solution 115 and the first purge solution 135. The second purge step 150 may generally continue until the dissolution solution 145 and/or the reactants contained with the dissolution solution 145 are completely removed from the surface of the substrate.

As described above, the cyclic wet ALE process shown in FIG. 1 includes: a) a surface modification step 100 that exposes the exposed surfaces of a high-k dielectric material 105 to a surface modification solution 115, which chemically modifies the exposed surfaces of the high-k dielectric material 105 to form a modified surface layer 125; b) a first purge step 130 to rinse the substrate with a first purge solution 135 to remove excess reactants from the surface; c) a dissolution step 140 that exposes the modified surface layer 125 to a dissolution solution 145 to selectively remove or dissolve the modified surface layer 125; and d) a second purge step 150 to rinse the substrate with a second purge solution 155 and displace the dissolution solution 145 from the surface of the substrate. In some embodiments, the steps a)-d) may be repeated for one or more ALE cycles, until a desired amount of the high-k dielectric material 105 has been removed. It is recognized that the cyclic wet ALE process shown in FIG. 1 is merely one example of an etch process that may be used to etch a high-k dielectric material 105, such as a transition metal oxide dielectric material.

As described above, the wet ALE process shown in FIG. 1 requires the formation of a self-limiting passivation layer on the transition metal oxide surface. The formation of this passivation layer is accomplished by exposure of the transition metal oxide surface to a first etch solution (i.e., surface modification solution 115) that enables or causes a chemical reaction (e.g., halogenation) between the halogen species in solution and the transition metal oxide surface. This passivation layer must be insoluble in the solution used for its formation, but freely soluble in the second etch solution (i.e., dissolution solution 145) used for its dissolution.

The present disclosure contemplates a wide variety of etch chemistries that may be used in the surface modification solution 115 and the dissolution solution 145 when etching a transition metal oxide layer using the wet ALE process shown in FIG. 1. Example etch chemistries are discussed in more detail below. Mixing of these solutions leads to a continuous etch process, loss of control of the etch and roughening of the post-etch surface, all of which undermines the benefits of wet ALE. Thus, purge steps 130 and 150 are performed in the wet ALE process shown in FIG. 1 to prevent direct contact between the surface modification solution 115 and the dissolution solution 145 on the substrate surface.

As noted above, the surface modification solution 115 may generally include an electrophilic halogenation agent 120 in a non-aqueous solvent. The electrophilic halogenation agent 120 may include an electrophilic fluorinating agent, an electrophilic chlorinating agent or an electrophilic brominating agent. Examples of electrophilic fluorinating agents include, but are not limited to, 1-chloromethyl-4-fluoro-1,4-diazoniabicyclo[2.2.2]octane bis(tetrafluoroborate) (tradename Selectfluor™), 1-fluoropyridinium triflate, 1-fluoro-2,4,6-trimethylpyridinium tetrafluoroborate, N-fluorobenzenesulfonimide, fluoroxytrifluoromethane, perchloryl fluoride, xenon difluoride and N-fluorobis[(trifluoromethyl)sulfonyl]imide. Examples of electrophilic chlorinating agents include, but are not limited to, trichloroisocyanuric acid (TCCA), oxalyl chloride, thionyl chloride, N-chlorosuccinimide, 1-chlorobenzotriazole, Chloramine-T and tert-butyl-N-chlorocyanamide. Examples of electrophilic brominating agents include N-bromosuccinimide, dibromoisocyanuric acid, tribromocyanuric acid, 1,3-Dibromo-5,5-Dimethylhydantoin and N-Bromoacetamide.

As noted above, the surface modification solution 115 may include an electrophilic halogenation agent 120 dissolved in an aqueous or non-aqueous solvent. In some embodiments, the electrophilic halogenation agent 120 may be dissolved in deionized (DI) water. In other embodiments, non-aqueous solvents may be used within the surface modification solution 115 if the halogenating reagents are sensitive to moisture. A wide variety of non-aqueous solvents may be used within the surface modification solution 115, depending on the halogenation agent selected. For example, the surface modification solution 115 may include an alcohol, an ether, a ketone, a halocarbon, a heterocyclic or another polar organic solvent. Specific examples of non-aqueous solvents that may be used within the surface modification solution 115 include, but are not limited to, acetonitrile, ethyl acetate, acetone, dimethyl sulfoxide, furans, dimethylformamide, methanol, isopropanol and dioxane. Other aqueous and non-aqueous solvents not specifically mentioned herein may also be used within the surface modification solution 115, as long as the electrophilic halogenation agent 120 dissolves within and does not react with the chosen solvent.

The electrophilic halogenation agent 120 and solvent used within the surface modification solution 115 may generally depend on the high-k dielectric material 105 to be etched. In some embodiments, the high-k dielectric material 105 may be a transition metal oxide, such as a zirconium dioxide ($ZrO_2$), hafnium dioxide ($HfO_2$) or hafnium zirconium oxide ($Hf_xZr_{(1-x)}O_2$) dielectric layer.

According to one embodiment, the wet ALE process shown in FIG. 1 may expose a transition metal oxide layer (e.g., a $HfO_2$, $ZrO_2$ or $Hf_xZr_{(1-x)}O_2$ dielectric layer) to a surface modification solution 115 containing a 1 wt % solution of Selectfluor™ in acetonitrile to chemically modify an exposed surface of the transition metal oxide layer and form a self-limiting transition metal halide or oxyhalide passivation layer on the transition metal oxide surface. The composition of the passivation layer may include halogens, oxygen, carbon and/or solvent molecules acting as ligands, as well as the metal centers from the transition metal oxide layer being etched. In general, however, the halogenation reaction displaces oxygen in the passivation layer to halogenate the transition metal oxide surface without oxidizing the surface. For example, when a $ZrO_2$ layer is exposed to a surface modification solution 115 containing an electrophilic halogenation agent 120, $F^-$ ions within the electrophilic halogenation agent 120 react with the $ZrO_2$ surface to displace the oxygen atoms on the $ZrO_2$ surface and produce a zirconium tetrafluoride ($ZrF_4$) passivation layer. In doing so, the electrophilic halogenation agent 120 halogenates the $ZrO_2$ surface without oxidizing the surface, leaving the modified surface layer (e.g., the $ZrF_4$ passivation layer) in the +4 oxidation state.

The self-limiting passivation layer formed during the surface modification step 100 must be removed every cycle after its formation. After rinsing the substrate with a first purge solution 135 (e.g., acetonitrile), a dissolution solution 145 is used in the dissolution step 140 to selectively dissolve this modified layer. When Selectfluor™ dissolved in acetonitrile is used in the surface modification solution 115 to form a zirconium fluoride ($ZrO_xF_y$) passivation layer on a zirconium dioxide ($ZrO_2$) surface, an aqueous solvent (such as deionized (DI) water) may be used in the dissolution step 140 to selectively dissolve the zirconium fluoride ($ZrO_xF_y$) passivation layer. When exposed to aqueous solvent, the zirconium fluoride ($ZrO_xF_y$) passivation layer forms water-soluble zirconium fluoride hydrates, which are dissolved by the aqueous solvent. The substrate can then be rinsed with a second purge solution 155 to remove the dissolution solution 145 and the zirconium fluoride hydrates dissolved therein to etch the zirconium dioxide ($ZrO_2$) layer.

$ZrO_2$ and $HfO_2$ are chemically very similar. So much so that methods to separate Hf and Zr are very difficult to develop. In some embodiments, the same etch chemistry can be used to etch $HfO_2$, $ZrO_2$ and the mixed metal $Hf_xZr_{(1-x)}O_2$ dielectric materials. For example, a 1 wt % solution of Selectfluor™ in acetonitrile can be used in the surface modification step 100 to form a hafnium fluoride ($HfO_xF_y$) passivation layer on a hafnium dioxide ($HfO_2$) surface, followed by an acetonitrile rinse in the first purge step 130, selective dissolution in an aqueous solvent (such as DI water) in the dissolution step 140 and an acetonitrile rinse in the second purge step 150. In some embodiments, ligands or pH modifiers can be added to the dissolution solution 145 to improve the solubility of the hafnium fluoride ($HfO_xF_y$) passivation layer. For example, the dissolution solution 145 may alternatively comprise an aqueous hydrochloric acid (HCl) solution. HCl helps solubilize hafnium fluoride through processes of ligand exchange and hydrolysis. In this embodiment, the hafnium fluoride passivation layer forms hafnium oxychloride species, which are dissolved by the aqueous HCl solution.

The wet ALE process shown in FIG. 1 and described above for etching transition metal oxide dielectrics can be accomplished using a variety of techniques. For example, the wet ALE process disclosed above may be performed by dipping a transition metal oxide sample in beakers of each etch solution. In this case, purging can be accomplished by either rinsing or dipping the sample in an appropriate solvent bath. The wet ALE process described above can also be accomplished on a spinner. For example, the transition metal oxide sample may be rotated while the etchant solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of transition metal oxide material. For high volume manufacturing, dispensing of etch solutions and rinses can be executed using conventional tools, such as wet etching tools and rinse tools.

New etch chemistries are described above for etching high-k dielectric layers, such as $HfO_2$, $ZrO_2$ and the mixed metal $Hf_xZr_{(1-x)}O_2$ dielectrics, in a wet ALE process. As noted above, the new etch chemistries disclosed herein use non-oxidative halogenation to form an insoluble transition metal halide or oxyhalide passivation layer, which is selectively removed in the subsequently performed dissolution step. Unlike conventional etch chemistries used to etch high-k dielectric layers, the etch chemistries described herein are highly selective to surrounding materials, and thus, avoid damaging the surrounding materials during the etch process.

Etching experiments were conducted to evaluate etching characteristics of the wet ALE chemistries disclosed herein for etching transition metal oxide dielectrics. FIGS. 2A-2B are graphs of quartz crystal microbalance (QCM) data obtained from a wet ALE process experiment, which used an etch chemistry in accordance with the present disclosure to etch a zirconium dioxide ($ZrO_2$) surface. The data shown in FIGS. 2A-2B was collected using a QCM crystal, which was coated with $ZrO_2$ and mounted in a flow cell. The QCM measures the resonant frequency of a piezoelectric crystal and can relate changes in the resonant frequency to changes in the mass loading on the crystal surface.

The etch recipe used to etch the $ZrO_2$ coated crystal included multiple wet ALE cycles, where each cycle included: (a) a surface modification solution containing a 1 wt % solution of Selectfluor™ in acetonitrile, (b) an acetonitrile rinse, (c) a dissolution solution containing DI water, and (d) an acetonitrile rinse. The etch chemistry described above was introduced into the flow cell at a flow rate of 1 mL/min. Each chemistry flowed through the cell for approximately one minute before the flow was changed to the next chemistry in the cycle.

The graph 200 shown in FIG. 2A illustrates the change in mass loading on the crystal surface (expressed in ng/cm2) and the change in $ZrO_2$ thickness (expressed in nm) over time (expressed in seconds) for a total of 11 wet ALE cycles. As shown in FIG. 2A, the first four wet ALE cycles do not show any overall mass response. This can be due to surface contamination on the wafer surface or surface chemistry that is slightly different than the bulk chemistry of the $ZrO_2$ film. Subsequent cycles, beginning with the fifth cycle, show a progressive mass loss at every DI water dissolution step with the equivalent of approximately 8 nm of $ZrO_2$ removed after the completion of 11 total cycles. The graph 200 shown in FIG. 2A shows a complicated mass response during the acetonitrile rinse steps. This could be due to acetonitrile acting as both a solvent and a ligand.

The graph 250 shown in FIG. 2B provides a more detailed view of the fifth and sixth wet ALE cycles shown in FIG. 2A. As shown in FIG. 2B, the wet etch chemistry described above provides approximately 3 monolayers of fluorination during each surface modification step with an additional 60% mass gain during the next acetonitrile rinse. Thus, approximately 3 monolayers of $ZrO_2$ are removed from the crystal every wet ALE cycle using the wet etch chemistry described above.

The data for the wet etch chemistry described above and shown in FIGS. 2A-2B was collected using a QCM flow cell. However, the etch chemistry can be implemented using several different techniques, such as dispensing the various etch solutions on a spinner or sequentially dipping the samples to be etched in the etch solutions. The only important consideration in implementing the wet etch chemistry described above is temporal separation of chemical exposures: i.e., the surface modification solution and the dissolution solution must be kept separate and prevented from mixing on the wafer surface. Any mixing of these two solutions can lead to a continuous etch process and an increase in surface roughness.

The wet ALE process described above relies on both the surface modification and dissolution reactions being self-limiting. Self-limiting means that only a limited thickness of the $ZrO_2$ film at the surface is modified or removed, regardless of how long a given etch solution is in contact with the $ZrO_2$ surface. The self-limiting reaction can be limited to one or more monolayers of reaction (e.g., 3 monolayers, as shown in FIG. 2B), or a partial monolayer of reaction.

Figure 3:
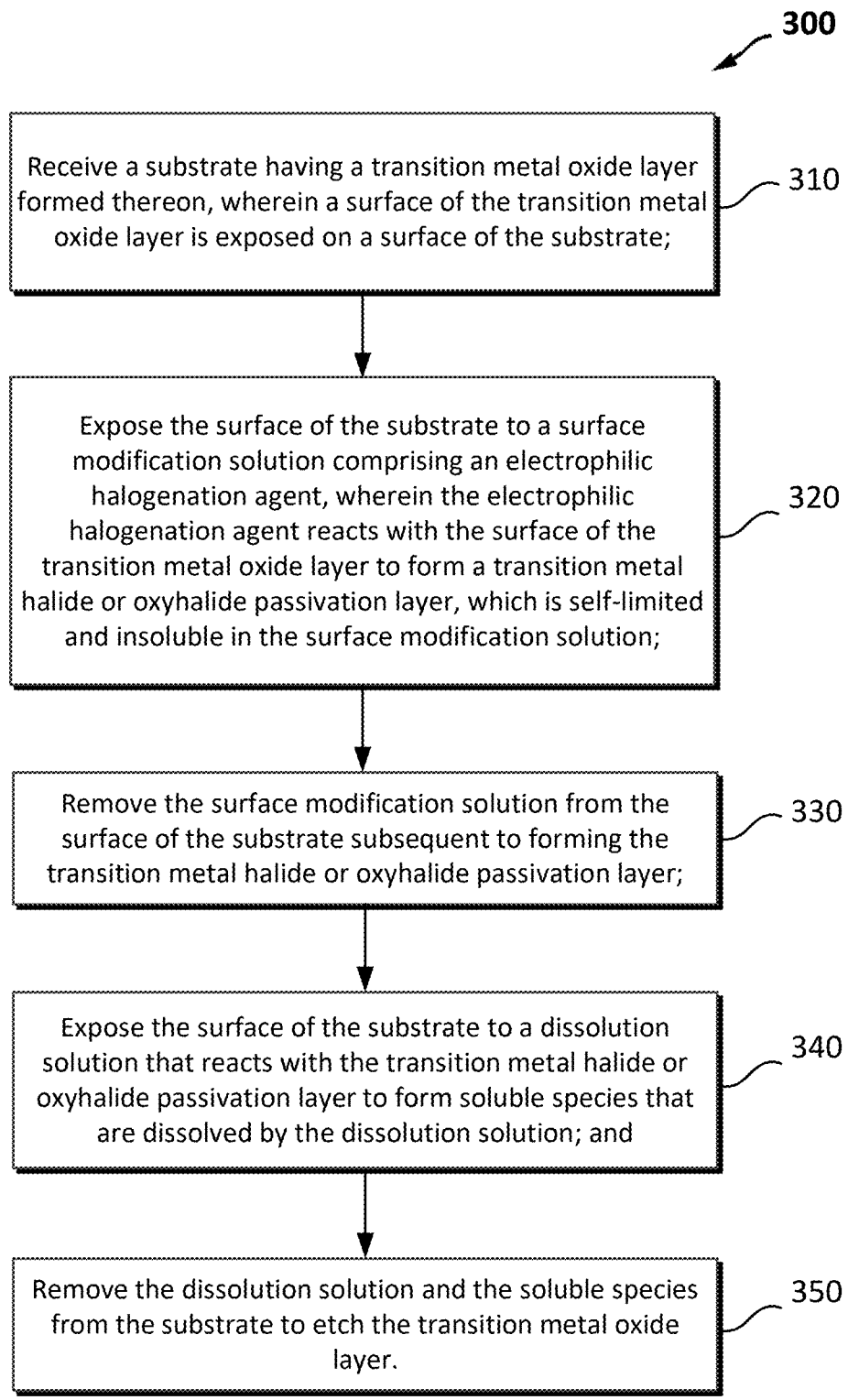
FIG. 3 is a flowchart diagram illustrating an embodiment of a method that utilizes the techniques described herein to etch a dielectric layer.
Figure 4:
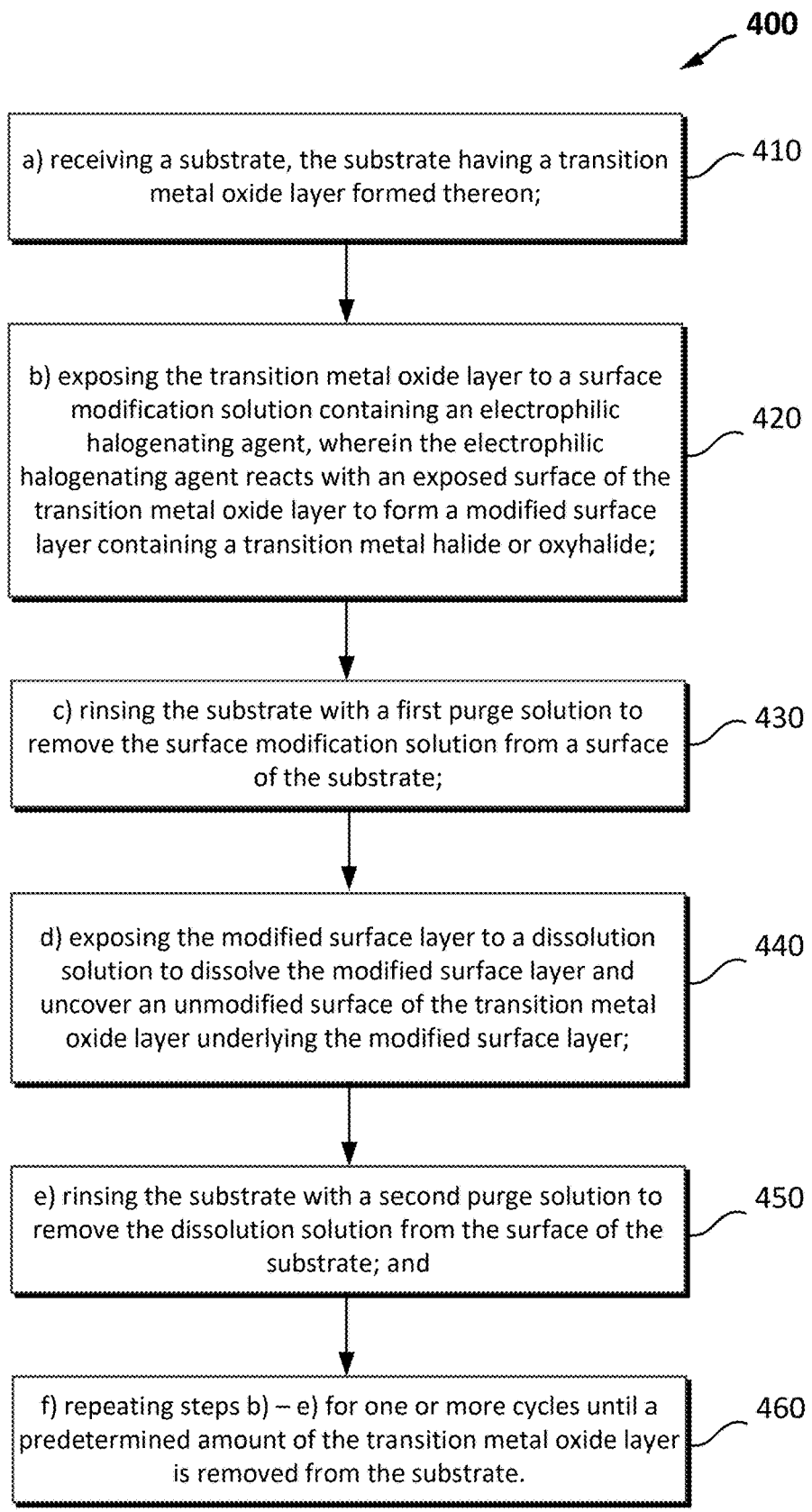
FIG. 4 is a flowchart diagram illustrating an embodiment of a method that utilizes the techniques described herein to etch a dielectric layer using a wet ALE process.

FIGS. 3-4 illustrate exemplary methods that utilize the etch chemistries described herein for etching high-k dielectric materials, such as transition metal oxide dielectrics, in a wet ALE process. It will be recognized that the embodiments of FIGS. 3-4 are merely exemplary and additional methods may utilize the techniques described herein. Further, additional processing steps may be added to the methods shown in the FIGS. 3-4 as the steps described are not intended to be exclusive. Moreover, the order of the steps is not limited to the order shown in the figures as different orders may occur and/or various steps may be performed in combination or at the same time.

FIG. 3 illustrates one embodiment of a method 300 of etching a dielectric layer. The method 300 shown in FIG. 3 may generally include receiving a substrate having a transition metal oxide layer formed thereon, wherein a surface of the transition metal oxide layer is exposed on a surface of the substrate (in step 310), and exposing the surface of the substrate to a surface modification solution comprising an electrophilic halogenation agent (in step 320). When exposed to the surface modification solution in step 320, the electrophilic halogenation agent reacts with the surface of the transition metal oxide layer to form a transition metal halide or oxyhalide passivation layer, which is self-limited and insoluble in the surface modification solution. Next, the method 300 may include removing the surface modification solution from the surface of the substrate subsequent to forming the transition metal halide or oxyhalide passivation layer (in step 330) and exposing the surface of the substrate to a dissolution solution that reacts with the transition metal halide or oxyhalide passivation layer to form soluble species that are dissolved by the dissolution solution (in step 340). Next, the method 300 may include removing the dissolution solution and the soluble species from the substrate to etch the transition metal oxide layer (in step 350).

In some embodiments, the method 300 may further include repeating the steps of exposing the surface of the substrate to the surface modification solution (in step 320), removing the surface modification solution (in step 330), exposing the surface of the substrate to the dissolution solution (in step 340), and removing the dissolution solution (in step 350) a number of cycles until a predetermined amount of the transition metal oxide layer is removed from the substrate.

FIG. 4 illustrates one embodiment of a method 400 that may be used for etching a dielectric layer using a wet atomic layer etching (ALE) process. The method 400 shown in FIG. 4 may generally include: a) receiving a substrate, the substrate having a transition metal oxide layer formed thereon (in step 410); b) exposing the transition metal oxide layer to a surface modification solution containing an electrophilic halogenating agent, wherein the electrophilic halogenating agent reacts with an exposed surface of the transition metal oxide layer to form a modified surface layer containing a transition metal halide or oxyhalide (in step 420); c) rinsing the substrate with a first purge solution to remove the surface modification solution from a surface of the substrate (in step 430); d) exposing the modified surface layer to a dissolution solution to dissolve the modified surface layer and uncover an unmodified surface of the transition metal oxide layer underlying the modified surface layer (in step 440); e) rinsing the substrate with a second purge solution to remove the dissolution solution from the surface of the substrate (in step 450); and f) repeating steps b)-e) for one or more cycles until a predetermined amount of the transition metal oxide layer is removed from the substrate (in step 460).

A variety of different etch chemistries may be used in the surface modification and dissolution solutions used in the method embodiments shown in FIGS. 3 and 4. As noted above, the surface modification solution may generally include an electrophilic halogenation agent in an aqueous or non-aqueous solvent. The electrophilic halogenation agent may include an electrophilic fluorinating agent, an electrophilic chlorinating agent or an electrophilic brominating agent, as described above in reference to FIG. 1. The aqueous solvent may be deionized (DI) water. The non-aqueous solvent may be an alcohol, an ether, a ketone, a halocarbon, a heterocyclic or another polar organic solvent. More specific examples of non-aqueous solvents are provided above.

The electrophilic halogenation agent and solvent selected for use within the surface modification solution may generally depend on the particular transition metal oxide to be etched. In some embodiments, the transition metal oxide layer to be etched may be a zirconium dioxide ($ZrO_2$), hafnium dioxide ($HfO_2$) or hafnium zirconium oxide ($Hf_xZr_{(1-x)}O_2$) dielectric layer.

When the transition metal oxide layer to be etched is a zirconium dioxide ($ZrO_2$) dielectric layer, the surface modification solution may include an electrophilic fluorinating agent (such as, e.g., Selectfluor™), which reacts with a surface of the zirconium dioxide ($ZrO_2$) dielectric layer to form a zirconium fluoride ($ZrO_xF_y$) passivation layer. When an electrophilic fluorinating agent is used in the surface modification solution to form a zirconium fluoride ($ZrO_xF_y$) passivation layer on a zirconium dioxide ($ZrO_2$) surface, the dissolution solution may include an aqueous solvent (such as, e.g., DI water). When exposed to an aqueous solvent, the zirconium fluoride ($ZrO_xF_y$) passivation layer forms water-soluble zirconium fluoride hydrates which are dissolved by the aqueous solvent.

When the transition metal oxide layer to be etched is a hafnium dioxide ($HfO_2$) dielectric layer, the surface modification solution may include an electrophilic fluorinating agent (such as, e.g., Selectfluor™), which reacts with a surface of the hafnium dioxide ($HfO_2$) dielectric layer to form a hafnium fluoride ($HfO_xF_y$) passivation layer. When an electrophilic fluorinating agent is used in the surface modification solution to form a hafnium fluoride ($HfO_xF_y$) passivation layer on the hafnium dioxide ($HfO_2$) surface, the dissolution solution may include an aqueous solvent (such as, e.g., DI water) or an aqueous solution containing a ligand. For example, the dissolution solution may be an aqueous hydrochloric acid (HCl) solution. When exposed to an aqueous HCl solution, the hafnium fluoride ($HfO_xF_y$) passivation layer forms hafnium oxychloride species, which are dissolved by the aqueous HCl solution.

The wet ALE process and new wet etch chemistries described herein for etching high-k dielectric materials, such as transition metal oxide dielectrics, may be utilized in a wide variety of applications and semiconductor fabrication processes. In some embodiments, the wet ALE process and new wet etch chemistries described herein may be utilized in the fabrication of transition metal dichalcogenide (TMD) transistors when etching through the high-k gate dielectric materials to open the transistor source and drain contacts.

TMD materials are two-dimensional (2D) semiconductor materials based on transition metal (M) and chalcogen (X) atoms. TMD materials have a crystalline structure, with one layer of M atoms (e.g., Mo, W, etc.) sandwiched between two layers of X atoms (e.g., S, Se, Te, etc.). Examples of TMD materials include, but are not limited to, molybdenum disulfide ($MoS_2$), molybdenum diselenide ($MoSe_2$), tungsten disulfide ($WS_2$), tungsten diselenide ($WSe_2$), etc. Due to their very thin structure and attractive electrical and mechanical properties, attempts have been made to use TMD materials within the channel region of transistor devices, like metal-oxide semiconductor field-effect transistors (MOSFETs), to improve the performance of such devices. However, challenges remain in fabricating transistors (otherwise referred to herein as TMD transistors) formed using 2D TMD materials.

Figure 5:
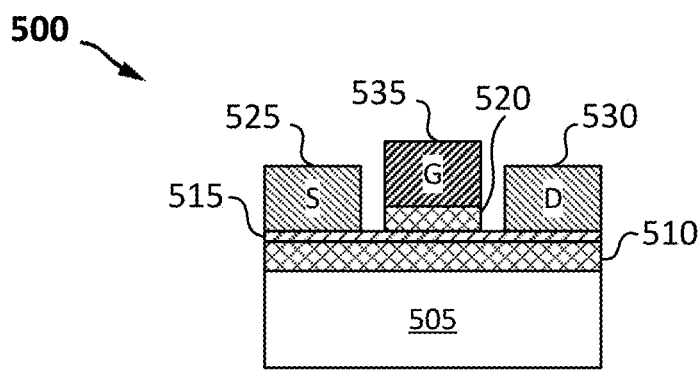
FIG. 5 is a schematic diagram illustrating one embodiment of a transition metal dichalcogenide (TMD) transistor.

FIG. 5 schematically illustrates a simplified example of a TMD transistor 500 having a 2D TMD material within a channel region of the transistor. As shown in FIG. 5, the TMD transistor 500 includes a first oxide layer 510 formed above a substrate 505, a TMD material 515 formed on the first oxide layer 510 and a second oxide layer 520 formed on the TMD material 515. The second oxide layer 520 is a high-k gate insulation material, such as a transition metal oxide. The transition metal oxide may be zirconium dioxide ($ZrO_2$), hafnium dioxide ($HfO_2$) or $Hf_xZr_{(1-x)}O_2$, in some embodiments. The first oxide layer 510 may be an oxide, such as silicon dioxide ($SiO_2$), or a transition metal oxide, such as $ZrO_2$, $HfO_2$ or $Hf_xZr_{(1-x)}O_2$. The TMD material 515 formed within the channel region of the TMD transistor 500 may include one or more monolayers of molybdenum disulfide ($MoS_2$), molybdenum diselenide ($MoSe_2$), tungsten disulfide ($WS_2$), tungsten diselenide ($WSe_2$), etc. In the example embodiment shown in FIG. 5, a source contact 525 and a drain contact 530 are formed above and in contact with the TMD material 515, while a gate contact 535 is formed above the high-k gate insulation material.

Prior to forming the source contact 525 and drain contact 530, an etch process is performed to etch through the second oxide layer 520 (the high-k gate insulation material) and open contact holes for the source and drain contacts. Conventional etch processes for opening the source/drain contact holes through transition metal oxide materials (such as $ZrO_2$, $HfO_2$ or $Hf_xZr_{(1-x)}O_2$ materials) include plasma etching with gas-phase hydrogen fluoride (HF) and wet etching with dilute hydrofluoric acid (HF) solution. However, the conventional methods used for etching these materials are unsatisfactory, since plasma etching methods destroys the TMD crystallinity, and wet etching with dilute HF solution leads to a continuous wet etch, which is not selective enough to prevent TMD damage.

Figure 6A:
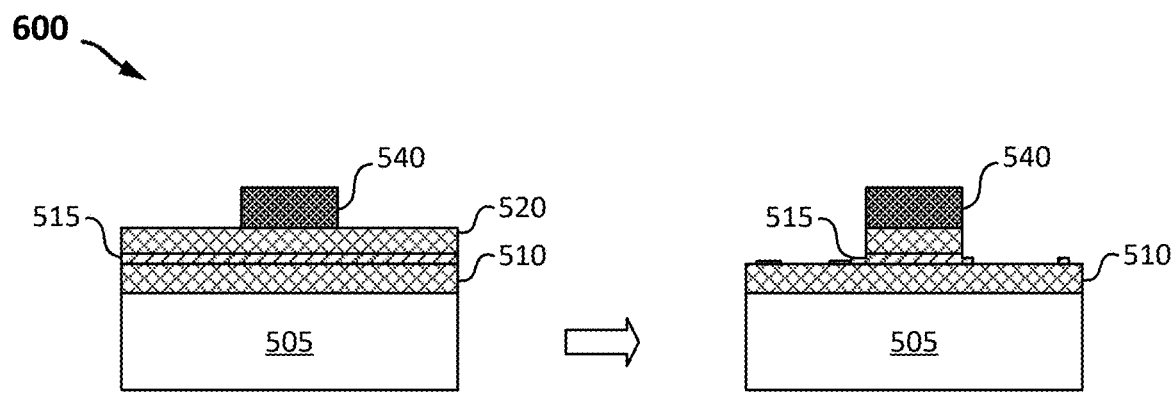
FIG. 6A is a process flow of a conventional etch process used to etch through the high-k gate insulation material of the TMD transistor shown in FIG. 5 to form source/drain contact holes, illustrating the damage that occurs to the TMD material during the etch.

The process flow 600 shown in FIG. 6A illustrates a conventional etch process, which may be used to etch through the second oxide layer 520 (the high-k gate insulation material) of the TMD transistor 500 shown in FIG. 5 to form source/drain contact holes. After forming first oxide layer 510, the TMD material 515 and the second oxide layer 520 above the substrate 505, a hard mask layer is formed above the second oxide layer 520 and patterned to provide a hard mask pattern 540 for use in etching the second oxide layer 520. As shown in FIG. 6A, etching the second oxide layer 520 using conventional etch processes damages the TMD material 515 by destroying the TMD crystallinity or etching through and removing the TMD material 515.

Figure 6B:
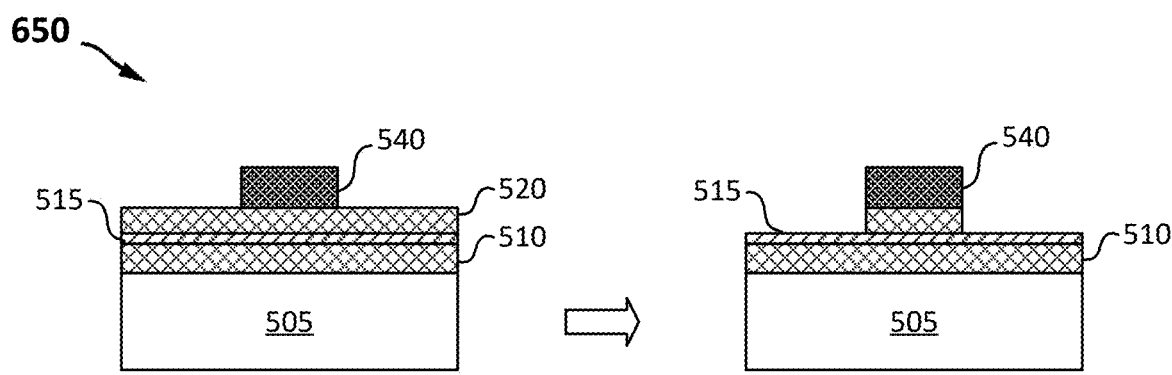
FIG. 6B is a process flow of an improved etch process that uses the techniques described herein to etch through the high-k gate insulation material of the TMD transistor shown in FIG. 5 to form source/drain contact holes, illustrating high selectivity of the improved etch process to the TMD material.

The process flow 650 shown in FIG. 6B illustrates an improved etch process that uses the techniques described herein to etch through the second oxide layer 520 (the high-k gate insulation material) of the TMD transistor 500 shown in FIG. 5 to form source/drain contact holes. The new etch chemistries described herein are highly selective to the TMD material 515 and can be used to etch through the second oxide layer 520 without damaging or removing the TMD material 515. By utilizing the new etch chemistries within a wet ALE process, the improved etch process shown in FIG. 6B provides greater control over the etch process to provide a soft landing on the TMD material 515.

Unlike the conventional etch process shown in FIG. 6A, the wet ALE process and wet etch chemistries disclosed herein are highly selective to the TMD material 515 used in the channel region of the TMD transistor 500. The high selectivity provided by the disclosed wet etch chemistries enables the TMD material 515 to be used as an etch stop without damaging or destroying the crystallinity of the TMD material. In addition to promoting a soft landing on the TMD material 515, the wet ALE process and wet etch chemistries disclosed herein improve etch uniformity, provide greater control over the etch amount, decrease the amount of over-etch typically required to open source/drain contact holes and leave the post-etch transition metal oxide surface smoother than the incoming surface. These advantages facilitate use of the wet ALE process and wet etch chemistries disclosed herein within TMD transistor fabrication process flows.

Figure 7:
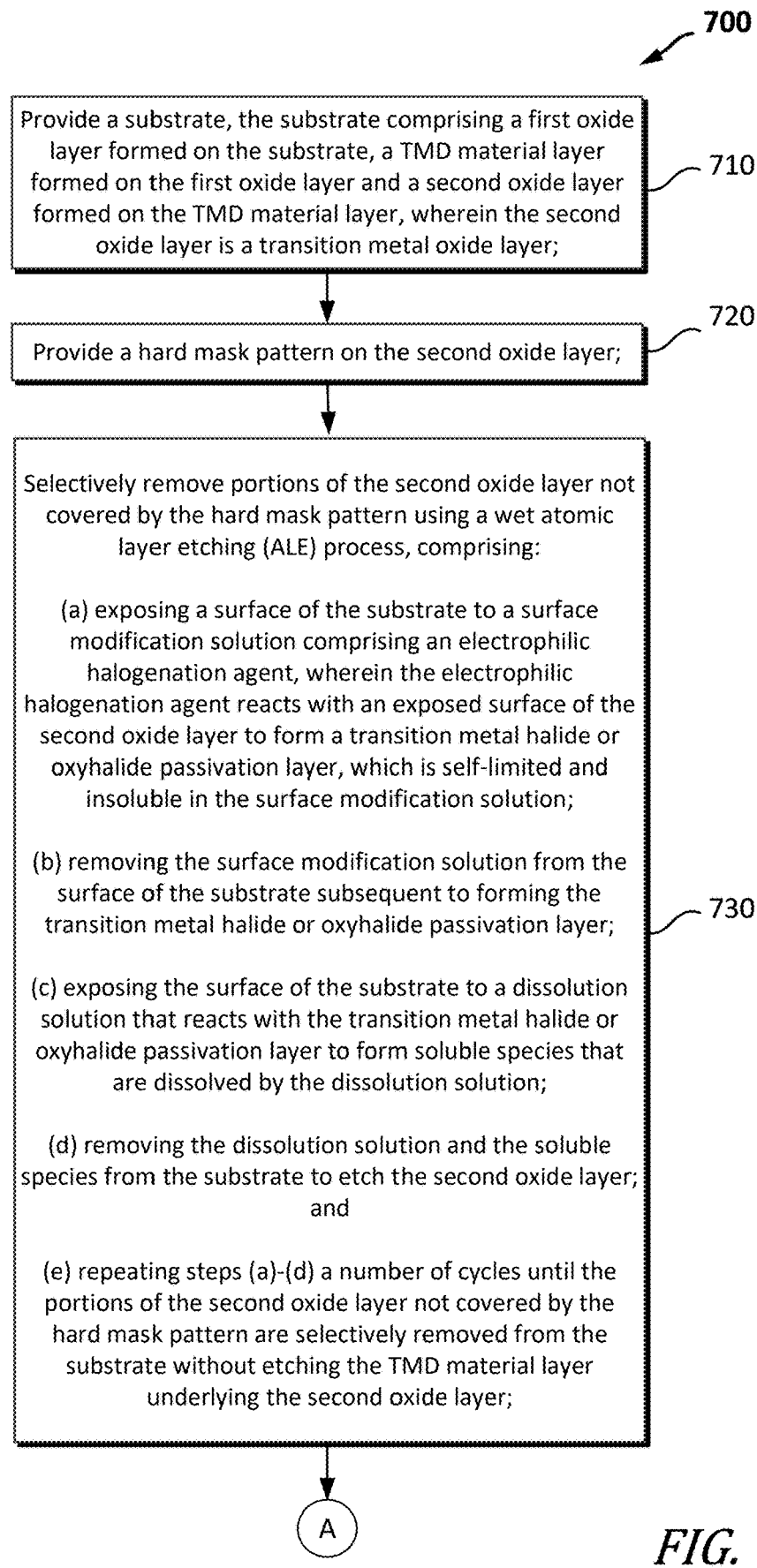
FIG. 7 is a flowchart diagram illustrating an embodiment of a method that utilizes the techniques described herein to form a TMD transistor.
Figure 7:
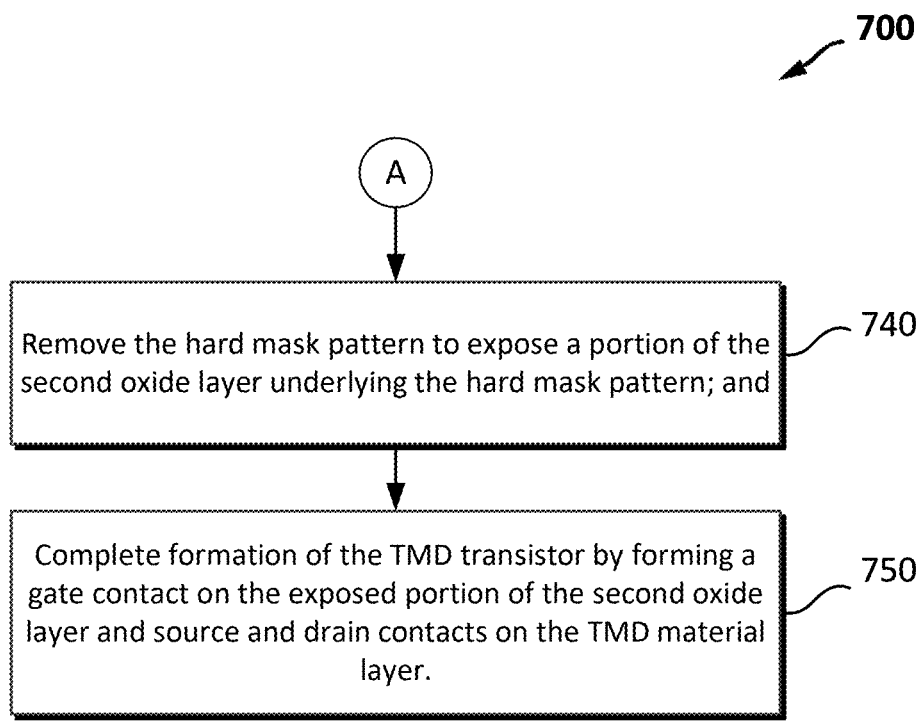

FIG. 7 illustrates one embodiment of a method 700 that utilizes the techniques described herein to form a transition metal dichalcogenide (TMD) transistor. It will be recognized that the embodiment of FIG. 7 is merely exemplary and additional methods may utilize the techniques described herein. Further, additional processing steps may be added to the method shown in FIG. 7 as the steps described are not intended to be exclusive. Moreover, the order of the steps is not limited to the order shown in the figures as different orders may occur and/or various steps may be performed in combination or at the same time.

The method 700 shown in FIG. 7 may generally include providing a substrate (in step 710), the substrate comprising a first oxide layer formed on the substrate, a TMD material formed on the first oxide layer and a second oxide layer formed on the TMD material. The second oxide layer may be a transition metal oxide layer, such as a zirconium dioxide ($ZrO_2$), hafnium dioxide ($HfO_2$) or hafnium zirconium oxide ($Hf_xZr_{(1-x)}O_2$) dielectric layer. After providing a hard mask pattern on the second oxide layer (in step 720), the method 700 may include selectively removing portions of the second oxide layer not covered by the hard mask pattern using a wet atomic layer etching (ALE) process (in step 730).

The wet ALE process performed in step 730 may generally include: (a) exposing a surface of the substrate to a surface modification solution comprising an electrophilic halogenation agent, wherein the electrophilic halogenation agent reacts with an exposed surface of the second oxide layer to form a transition metal halide or oxyhalide passivation layer, which is self-limiting and insoluble in the surface modification solution; (b) removing the surface modification solution from the surface of the substrate subsequent to forming the transition metal halide or oxyhalide passivation layer; (c) exposing the surface of the substrate to a dissolution solution that reacts with the transition metal halide or oxyhalide passivation layer to form soluble species that are dissolved by the dissolution solution; (d) removing the dissolution solution and the soluble species from the substrate to etch the second oxide layer; and (e) repeating steps (a)-(d) a number of cycles until the portions of the second oxide layer not covered by the hard mask pattern are selectively removed from the substrate without etching the TMD material underlying the second oxide layer.

In some embodiments, the method 700 may further include removing the hard mask pattern to expose a portion of the second oxide layer underlying the hard mask pattern (in step 740), and completing formation of the TMD transistor by forming a gate contact on the exposed portion of the second oxide layer and source and drain contacts on the TMD material (in step 750).

As noted above with respect to FIGS. 1-4, a variety of different etch chemistries may be used in the surface modification and dissolution solutions, depending on the transition metal oxide layer being etched. While example etch chemistries are discussed above for etching zirconium dioxide ($ZrO_2$), hafnium dioxide ($HfO_2$), one skilled in the art would understand how other surface modification solutions containing an electrophilic halogenation agent in an aqueous or non-aqueous solvent and other dissolution solutions containing aqueous or non-aqueous solvents may also be used.

The wet ALE process described herein may be performed within a wide variety of semiconductor processing systems. While the wet ALE process described herein can be accomplished using many different process chambers, tools and apparatuses, the processing equipment used to perform the wet ALE process is preferably capable of running at (or near) room temperature and at (or near) atmospheric pressure. In one example implementation, the wet ALE process described herein may be performed within a spin chamber. When a spin chamber is utilized, etch solutions are dispensed from a nozzle positioned over the substrate and are distributed by the rotational motion of a spin chuck on which the substrate is disposed.

Figure 8:
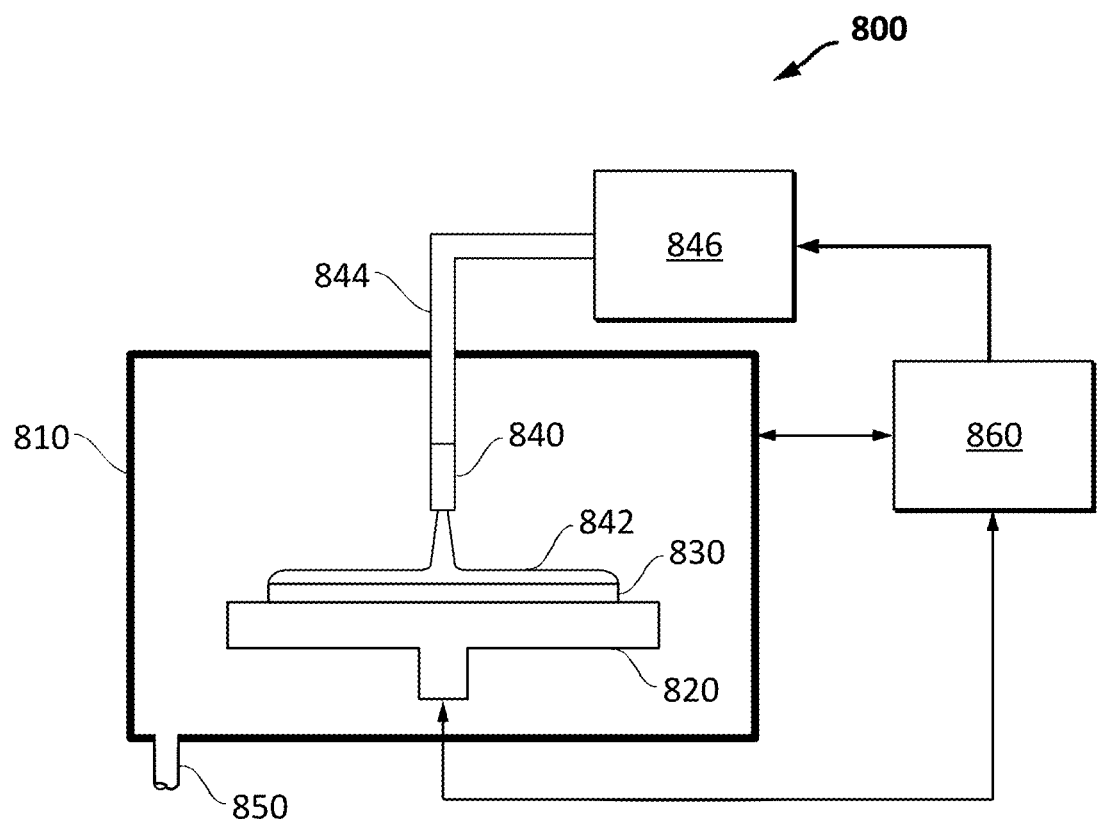
FIG. 8 is a block diagram of an example processing system that uses the techniques described herein to etch a transition metal oxide layer.

FIG. 8 illustrates one embodiment of a processing system 800 that may use the techniques described herein to etch high-k dielectric materials, such as transition metal oxide dielectrics, on a surface of a substrate 830. As shown in FIG. 8, the processing system 800 includes a process chamber 810, which in some embodiments, may be a pressure controlled chamber. In the embodiment shown in FIG. 8, the process chamber 810 is a spin chamber having a spinner 820 (or spin chuck), which is configured to spin or rotate at a rotational speed. A substrate 830 is held on the spinner 820, for example, via electrostatic force or vacuum pressure. In one example, the substrate 830 may be a semiconductor wafer having a high-k dielectric material, such as a transition metal oxide dielectric, formed on or within the substrate 830.

The processing system 800 shown in FIG. 8 further includes a liquid nozzle 840, which is positioned over the substrate 830 for dispensing various etch solutions 842 onto a surface of the substrate 830. The etch solutions 842 dispensed onto the surface of the substrate 830 may generally include a surface modification solution to chemically modify the transition metal oxide surface and form a modified surface layer (e.g., a transition metal halide or oxyhalide passivation layer), and a dissolution solution to selectively remove the modified surface layer from the transition metal oxide surface. Purge solutions may also be dispensed onto the surface of the substrate 830 between surface modification and dissolution steps to separate the surface modification and dissolution solutions. Examples of surface modification, dissolution and purge solutions are discussed above.

As shown in FIG. 8, the etch solutions 842 may be stored within a chemical supply system 846, which may include one or more reservoirs for holding the various etch solutions 842 and a chemical injection manifold, which is fluidly coupled to the process chamber 810 via a liquid supply line 844. In operation, the chemical supply system 846 may selectively apply desired chemicals to the process chamber 810 via the liquid supply line 844 and the liquid nozzle 840 positioned within the process chamber 810. Thus, the chemical supply system 846 can be used to dispense the etch solutions 842 onto the surface of the substrate 830. The process chamber 810 may further include a drain 850 for removing the etch solutions 842 from the process chamber 810.

Components of the processing system 800 can be coupled to, and controlled by, a controller 860, which in turn, can be coupled to a corresponding memory storage unit and user interface (not shown). Various processing operations can be executed via the user interface, and various processing recipes and operations can be stored in the memory storage unit. Accordingly, a given substrate 830 can be processed within the process chamber 810 in accordance with a particular recipe. In some embodiments, a given substrate 830 can be processed within the process chamber 810 in accordance with an etch recipe that utilizes the wet ALE techniques described herein for etching a transition metal oxide surface.

The controller 860 shown in block diagram form in FIG. 8 can be implemented in a wide variety of manners. In one example, the controller 860 may be a computer. In another example, the controller 860 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed plasma process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 8, the controller 860 may be coupled to various components of the processing system 800 to receive inputs from, and provide outputs to, the components. For example, the controller 860 may be coupled to: the process chamber 810 for controlling the temperature and/or pressure within the process chamber 810; the spinner 820 for controlling the rotational speed of the spinner 820; and the chemical supply system 846 for controlling the various etch solutions 842 dispensed onto the substrate 830. The controller 860 may control other processing system components not shown in FIG. 8, as is known in the art.

In some embodiments, the controller 860 may control the various components of the processing system 800 in accordance with an etch recipe that utilizes the wet ALE techniques described herein for etching a high-k dielectric layer, such as a transition metal oxide layer. For example, the controller 860 may supply various control signals to the chemical supply system 846, which cause the chemical supply system 846 to: a) dispense a surface modification solution onto the surface of the substrate 830 to chemically modify exposed surfaces of the transition metal oxide layer and create a modified surface layer (e.g., a transition metal halide or oxyhalide passivation layer) on the substrate 830; b) rinse the substrate 830 with a first purge solution to remove excess reactants from the surface; c) dispense a dissolution solution onto the surface of the substrate 830 to selectively remove or dissolve the modified surface layer; and d) rinse the substrate with a second purge solution to remove the dissolution solution from the surface of the substrate 830. In some embodiments, the controller 860 may supply the control signals to the chemical supply system 846 in a cyclic manner, such that the steps a)-d) are repeated for one or more ALE cycles, until a desired amount of the transition metal oxide layer has been removed.

The controller 860 may also supply control signals to other processing system components. In some embodiments, for example, the controller 860 may supply control signals to the spinner 820 and/or the chemical supply system 846 to dry the substrate 830 after the second purge step is performed. In one example, the controller 860 may control the rotational speed of the spinner 820, so as to dry the substrate 830 in a spin dry step. In another example, control signals supplied from the controller 860 to the chemical supply system 846 may cause a drying agent (such as, e.g., isopropyl alcohol) to be dispensed onto the surface of the substrate 830 to further assist in drying the substrate before performing the spin dry step.

In some embodiments, the controller 860 may control the temperature and/or the pressure within the process chamber 810. In some embodiments, the surface modification, dissolution and purge steps of the wet ALE process described herein may be performed at roughly the same temperature and pressure. In one example implementation, the surface modification, dissolution and purge steps may each be performed at (or near) atmospheric pressure and room temperature. Performing the processing steps within the same process chamber at roughly the same temperature and pressure decreases the cycle time and improves the throughput of the wet ALE process described herein by avoiding unnecessary chamber transitions and temperature/pressure changes.

It is noted, however, that the embodiments described herein are not strictly limited to only atmospheric pressure and room temperature, nor are they limited to a particular process chamber. In other embodiments, one or more of the surface modification, dissolution and purge steps can be run at above atmospheric pressure in a pressure vessel, or at reduced pressure in a vacuum chamber. Etch solutions can be dispensed in these environments as long as the vapor pressure of the liquid is lower than the chamber pressure. For these implementations, a spinner with a liquid dispensing nozzle would be placed in the pressure vessel or vacuum chamber. The temperature of the liquid being dispensed can be elevated to any temperature below its boiling point at the pressure of the process. In one example implementation, the dissolution step may be performed at 100° C. As noted above, higher liquid temperatures can increase the kinetics of dissolution.

The present disclosure provides systems and methods that utilize new etch chemistries in a wet ALE process for etching high-k dielectric materials, such as transition metal oxide dielectrics, on a surface of a substrate. Although example etch chemistries are provided herein for etching zirconium dioxide ($ZrO_2$) and hafnium dioxide ($HfO_2$), one skilled in the art would understand how the techniques described herein could be used to etch other transition metals (such as ruthenium) and transition metal oxides.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching a dielectric layer, the method comprising:
   receiving a substrate having a transition metal oxide layer formed thereon, wherein a surface of the transition metal oxide layer is exposed on a surface of the substrate;
   exposing the surface of the substrate to a surface modification solution comprising an electrophilic halogenation agent, wherein the electrophilic halogenation agent reacts with the surface of the transition metal oxide layer to form a transition metal halide or oxyhalide passivation layer, which is self-limited and insoluble in the surface modification solution;
   removing the surface modification solution from the surface of the substrate subsequent to forming the transition metal halide or oxyhalide passivation layer;
   exposing the surface of the substrate to a dissolution solution that reacts with the transition metal halide or oxyhalide passivation layer to form soluble species that are dissolved by the dissolution solution; and
   removing the dissolution solution and the soluble species from the substrate to etch the transition metal oxide layer.

2. The method of claim 1, further comprising repeating said exposing the surface of the substrate to the surface modification solution, removing the surface modification solution, exposing the surface of the substrate to the dissolution solution, and removing the dissolution solution a number of cycles until a predetermined amount of the transition metal oxide layer is removed from the substrate.

3. The method of claim 1, wherein the electrophilic halogenation agent comprises an electrophilic fluorinating agent, an electrophilic chlorination agent or an electrophilic brominating agent.

4. The method of claim 3, wherein the electrophilic fluorinating agent comprises 1-chloromethyl-4-fluoro-1,4-diazoniabicyclo[2.2.2]octane bis(tetrafluoroborate), 1-fluoropyridinium triflate, 1-fluoro-2,4,6-trimethylpyridinium tetrafluoroborate, N-fluorobenzenesulfonimide, fluoroxytrifluoromethane, perchloryl fluoride, xenon difluoride or N-fluorobis[(trifluoromethyl)sulfonyl]imide.

5. The method of claim 3, wherein the electrophilic chlorinating agent comprises trichloroisocyanuric acid (TCCA), oxalyl chloride, thionyl chloride, N-chlorosuccinimide, 1-chlorobenzotriazole, Chloramine-T or tert-butyl-N-chlorocyanamide.

6. The method of claim 3, wherein the electrophilic brominating agent comprises N-bromosuccinimide, dibromoisocyanuric acid, tribromocyanuric acid, 1,3-Dibromo-5,5-Dimethylhydantoin or N-Bromoacetamide.

7. The method of claim 1, wherein the surface modification solution further comprises an aqueous solvent or a non-aqueous solvent, wherein the aqueous solvent is deionized water, and wherein the non-aqueous solvent comprises an alcohol, an ether, a ketone, a halocarbon or a heterocyclic.

8. The method of claim 1, wherein the surface modification solution further comprises a non-aqueous solvent, and wherein the non-aqueous solvent comprises acetonitrile, ethyl acetate, acetone, dimethyl sulfoxide, furans, dimethylformamide, methanol, isopropanol or dioxane.

9. The method of claim 1, wherein the transition metal oxide layer is a zirconium dioxide ($ZrO_2$), hafnium dioxide ($HfO_2$) or hafnium zirconium oxide ($Hf_xZr_{(1-x)}O_2$, where $0<x<1$) dielectric layer.

10. The method of claim 1, wherein the transition metal oxide layer is a zirconium dioxide ($ZrO_2$) dielectric layer, and wherein the surface modification solution includes an electrophilic fluorinating agent, which reacts with a surface of the zirconium dioxide ($ZrO_2$) dielectric layer to form a zirconium fluoride passivation layer.

11. The method of claim 10, wherein the dissolution solution comprises an aqueous solvent, and wherein when exposed to the aqueous solvent, the zirconium fluoride passivation layer forms water-soluble zirconium fluoride hydrates which are dissolved by the aqueous solvent.

12. The method of claim 1, wherein the transition metal oxide layer is a hafnium dioxide ($HfO_2$) dielectric layer, and wherein the surface modification solution includes an electrophilic fluorinating agent, which reacts with a surface of the hafnium dioxide ($HfO_2$) dielectric layer to form a hafnium fluoride passivation layer.

13. The method of claim 12, wherein the dissolution solution is an aqueous hydrochloric acid (HCl) solution, and wherein when exposed to the aqueous HCl solution, the hafnium fluoride passivation layer forms hafnium oxychloride species, which are dissolved by the aqueous HCl solution.

14. A method of etching a dielectric layer using a wet atomic layer etching (ALE) process, the method comprising:
   a) receiving a substrate, the substrate having a transition metal oxide layer formed thereon;
   b) exposing the transition metal oxide layer to a surface modification solution containing an electrophilic halogenating agent, wherein the electrophilic halogenating agent reacts with an exposed surface of the transition metal oxide layer to form a modified surface layer containing a transition metal halide or oxyhalide;
   c) rinsing the substrate with a first purge solution to remove the surface modification solution from a surface of the substrate;
   d) exposing the modified surface layer to a dissolution solution to dissolve the modified surface layer and uncover an unmodified surface of the transition metal oxide layer underlying the modified surface layer;
   e) rinsing the substrate with a second purge solution to remove the dissolution solution from the surface of the substrate; and
   f) repeating steps b)-e) for one or more cycles until a predetermined amount of the transition metal oxide layer is removed from the substrate.

15. The method of claim 14, wherein the transition metal oxide layer comprises a zirconium dioxide ($ZrO_2$), hafnium dioxide ($HfO_2$) or hafnium zirconium oxide ($Hf_xZr_{(1-x)}O_2$, where 0<x<1) dielectric layer.

16. The method of claim 14, wherein the transition metal oxide layer is a zirconium dioxide ($ZrO_2$) dielectric layer, wherein the surface modification solution comprises an electrophilic fluorinating agent and the dissolution solution comprises an aqueous solvent, and wherein:
   when the zirconium dioxide ($ZrO_2$) dielectric layer is exposed to the surface modification solution, the electrophilic fluorinating agent reacts with a surface of the zirconium dioxide ($ZrO_2$) dielectric layer to form a zirconium fluoride passivation layer; and
   when the zirconium fluoride passivation layer is exposed to the dissolution solution, the zirconium fluoride passivation layer forms water-soluble zirconium fluoride hydrates which are dissolved by the aqueous solvent.

17. The method of claim 14, wherein the transition metal oxide layer is a hafnium dioxide ($HfO_2$) dielectric layer, wherein the surface modification solution comprises an electrophilic fluorinating agent and the dissolution solution comprises an aqueous hydrochloric acid (HCl) solution, and wherein:
   when the hafnium dioxide ($HfO_2$) dielectric layer is exposed to the surface modification solution, the electrophilic fluorinating agent reacts with a surface of the hafnium dioxide (HfO2) dielectric layer to form a hafnium fluoride passivation layer; and
   when the hafnium fluoride passivation layer is exposed to the dissolution solution, the hafnium fluoride passivation layer forms hafnium oxychloride species, which are dissolved by the aqueous HCl solution.

18. A method of forming a transition metal dichalcogenide (TMD) transistor, the method comprising:
   providing a substrate, the substrate comprising a first oxide layer formed on the substrate, a TMD material formed on the first oxide layer and a second oxide layer formed on the TMD material, wherein the second oxide layer is a transition metal oxide layer;
   providing a hard mask pattern on the second oxide layer;
   selectively removing portions of the second oxide layer not covered by the hard mask pattern using a wet atomic layer etching (ALE) process, comprising:
      (a) exposing a surface of the substrate to a surface modification solution comprising an electrophilic halogenation agent, wherein the electrophilic halogenation agent reacts with an exposed surface of the second oxide layer to form a transition metal halide or oxyhalide passivation layer, which is self-limiting and insoluble in the surface modification solution;
      (b) removing the surface modification solution from the surface of the substrate subsequent to forming the transition metal halide or oxyhalide passivation layer;
      (c) exposing the surface of the substrate to a dissolution solution that reacts with the transition metal halide or oxyhalide passivation layer to form soluble species that are dissolved by the dissolution solution;
      (d) removing the dissolution solution and the soluble species from the substrate to etch the second oxide layer; and
      (e) repeating steps (a)-(d) a number of cycles until the portions of the second oxide layer not covered by the hard mask pattern are selectively removed from the substrate without etching the TMD material underlying the second oxide layer.

19. The method of claim 18, further comprising:
   removing the hard mask pattern to expose a portion of the second oxide layer underlying the hard mask pattern; and
   completing formation of the TMD transistor by forming a gate contact on the exposed portion of the second oxide layer and source and drain contacts on the TMD material.

20. The method of claim 18, wherein the transition metal oxide layer comprises a zirconium dioxide ($ZrO_2$), hafnium dioxide ($HfO_2$) or hafnium zirconium oxide ($Hf_xZr_{(1-x)}O_2$, where 0<x<1) dielectric layer.

21. The method of claim 18, wherein the transition metal oxide layer is a zirconium dioxide ($ZrO_2$) dielectric layer, wherein the surface modification solution comprises an electrophilic fluorinating agent and the dissolution solution comprises an aqueous solvent, and wherein:
   when the zirconium dioxide ($ZrO_2$) dielectric layer is exposed to the surface modification solution, the electrophilic fluorinating agent reacts with a surface of the zirconium dioxide (ZrO2) dielectric layer to form a zirconium fluoride passivation layer; and
   when the zirconium fluoride passivation layer is exposed to the dissolution solution, the zirconium fluoride passivation layer forms water-soluble zirconium fluoride hydrates which are dissolved by the aqueous solvent.

22. The method of claim 18, wherein the transition metal oxide layer is a hafnium dioxide ($HfO_2$) dielectric layer, wherein the surface modification solution comprises an electrophilic fluorinating agent and the dissolution solution comprises an aqueous hydrochloric acid (HCl) solution, and wherein:

when the hafnium dioxide ($HfO_2$) dielectric layer is exposed to the surface modification solution, the electrophilic fluorinating agent reacts with a surface of the hafnium dioxide (HfO2) dielectric layer to form a hafnium fluoride passivation layer; and when the hafnium fluoride passivation layer is exposed to the dissolution solution, the hafnium fluoride passivation layer forms hafnium oxychloride species, which are dissolved by the aqueous HCl solution.

\* \* \* \* \*